(12) United States Patent
Van Helvoort et al.

(10) Patent No.: US 6,670,863 B2
(45) Date of Patent: Dec. 30, 2003

(54) DEVICE FOR SUPPRESSING ELECTROMAGNETIC COUPLING PHENOMENA

(75) Inventors: Marinus Johannes Adrianus Maria Van Helvoort, Eindhoven (NL); Eerke Holle, Eindhoven (NL); Cornelis Wilhelmus Jacobs, Eindhoven (NL); Math Rietjens, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/243,078

(22) Filed: Sep. 13, 2002

(65) Prior Publication Data

US 2003/0057948 A1 Mar. 27, 2003

(30) Foreign Application Priority Data

Sep. 14, 2001 (EP) .............................................. 01203485

(51) Int. Cl.[7] .............................. H03H 7/12; G01V 3/00
(52) U.S. Cl. ......................... 333/12; 333/176; 333/206; 324/318; 324/322
(58) Field of Search ................................ 324/318, 322; 333/12, 176, 206, 245

(56) References Cited

U.S. PATENT DOCUMENTS

| | | | | |
|---|---|---|---|---|
| 3,518,583 A | * | 6/1970 | Yunoki et al. ............... 333/206 |
| 4,376,920 A | * | 3/1983 | Smith ........................... 333/12 |
| 4,383,225 A | * | 5/1983 | Mayer .......................... 333/12 |
| 4,510,468 A | * | 4/1985 | Mayer .......................... 333/12 |
| 4,641,110 A | * | 2/1987 | Smith ........................... 333/12 |
| 4,775,837 A | * | 10/1988 | Roschmann ................. 324/322 |
| 4,841,259 A | * | 6/1989 | Mayer ........................ 333/17.2 |
| 4,885,555 A | * | 12/1989 | Palmer ......................... 333/12 |
| 4,922,204 A | * | 5/1990 | Duerr et al. ................. 324/322 |
| 5,049,821 A | * | 9/1991 | Duensing et al. ........... 324/322 |
| 5,363,113 A | * | 11/1994 | Mametsa et al. ............ 343/744 |
| 5,477,147 A | | 12/1995 | Friedrich et al. |
| 5,742,165 A | * | 4/1998 | Snelten et al. .............. 324/318 |
| 6,219,570 B1 | | 4/2001 | Mueller et al. |
| 6,596,945 B1 | * | 7/2003 | Hughey et al. .......... 174/125.1 |

FOREIGN PATENT DOCUMENTS

JP          62207942          9/1987

* cited by examiner

Primary Examiner—Diego Gutierrez
Assistant Examiner—Dixomara Vargas
(74) Attorney, Agent, or Firm—Thomas M. Lundin, Esq.

(57) ABSTRACT

The invention relates to a resonance trap (8) for suppressing electromagnetic coupling phenomena for a line (1), which resonance trap includes a conductor (10) which extends parallel to and along a part of the length of the line (1). Conventional resonance traps (8) have the drawback that a direct connection exists between the RF line and the individual resonance traps (8). It is an object of the invention to provide a resonance trap (8) which enables a modular assembly on the line (1). The object is achieved by means of a resonance trap (8) of the kind set forth in which inner conductors (10) extend parallel to the line (1) and in which outer conductors (11) extend parallel to the inner conductors (10), said inner conductors (10) being arranged at a radial distance from the line (1) which is smaller than that at which the outer conductors (11) are arranged and the outer conductors (11) being arranged to cover at least partly the inner conductors (10) in the radial direction relative to the line (1). This offers the advantage that the connection between the resonance trap (8) and the line (1) is dispensed with.

13 Claims, 8 Drawing Sheets

US 6,670,863 B2

DEVICE FOR SUPPRESSING ELECTROMAGNETIC COUPLING PHENOMENA

BACKGROUND

Figure 1:
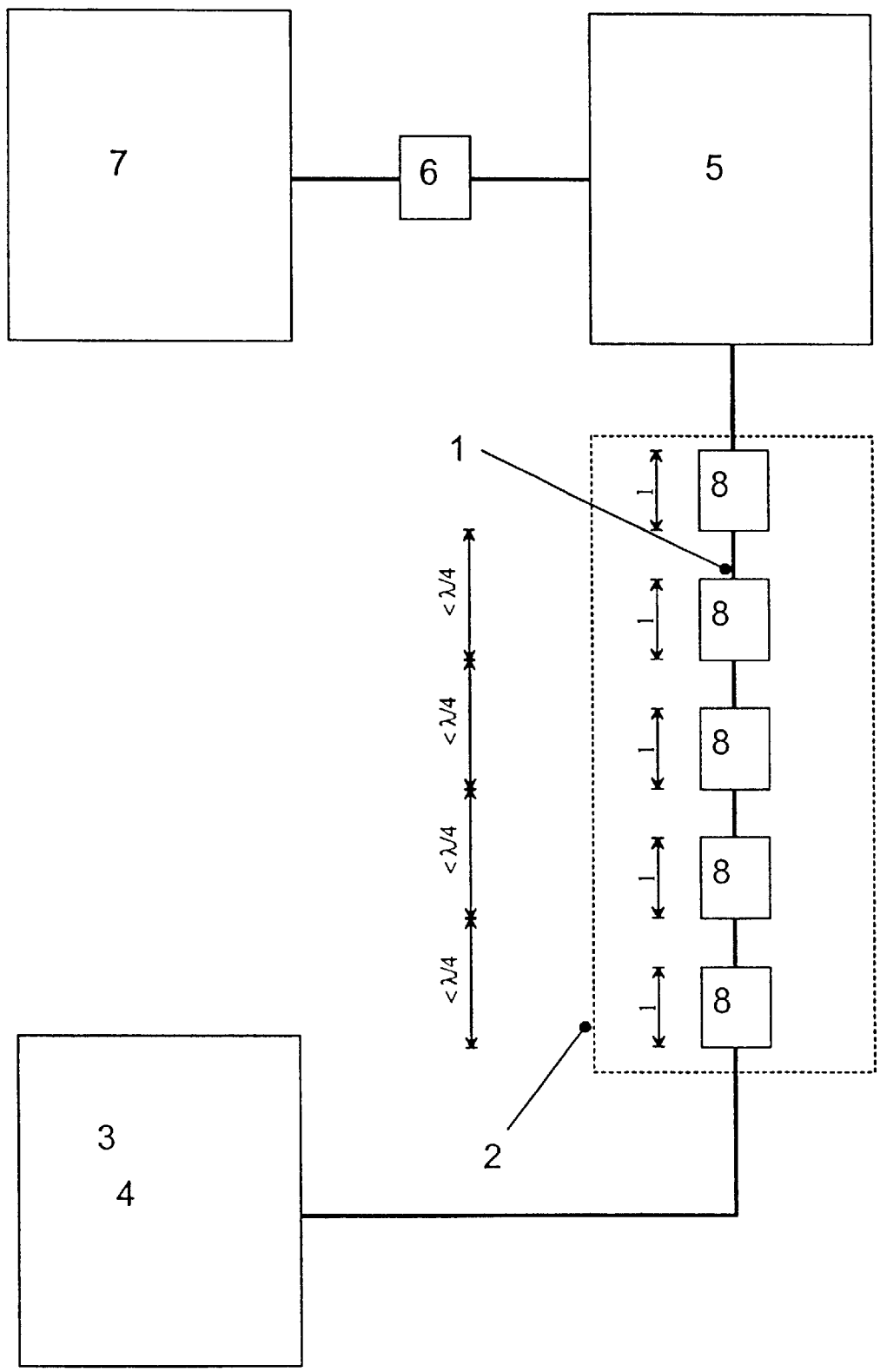

The invention relates to a resonance trap for suppressing electromagnetic coupling phenomena for at least one line for conducting electric currents or electromagnetic waves, notably for RF alternating currents in an MR apparatus, which resonance trap includes a conductor which extends along a part of the length of the line.

In the context of a typical magnetic resonance imaging method the magnetic moment of the protons is oriented in one spatial direction by means of a strong, steady magnetic field of, for example, 1.5 Tesla. Using brief electromagnetic RF pulses, the individual protons are excited to precession and subsequently become oriented in conformity with the external, strong magnetic field again. In particular the excitation and relaxation times and the frequencies of the precessional motions are dependent on the tissue and in the context of the measurement they provide, in conjunction with a position code of the excitation, information concerning the situation in space of various tissues. The position code utilizes position-dependent frequencies and phases of the precessional excitation and enables information on the location of the relevant emission to be derived via Fourier transformation of the measured MR signal.

In order to achieve a high image quality it makes sense to utilize several characteristics so as to distinguish the types of tissue being examined. The speed at which the magnetic fields in the MR apparatus can be varied represent forms a limiting factor in achieving a high image quality within an acceptable examination time. Therefore, it is continuously being attempted to develop coil systems which enable high magnetic field strength transients to be obtained in conjunction with amplifiers and voltage sources.

In order to generate the magnetic field strength gradients desired for the position code, it is common practice to use different coil systems in three mutually perpendicular spatial directions. Two Helmholz coils which face one another are usually arranged in the direction of the longitudinal axis of the body, that is, the axis which is usually referred to as the z axis. In the direction perpendicular to the longitudinal axis of the body there are usually provided spiral-like planar coils which are arranged opposite one another so as to enclose the examination volume in a cylindrical fashion. Along the longitudinal axis of the body two or more of such spiral-like coils are often provided for a spatial direction extending perpendicularly to the longitudinal axis of the body. The two spatial directions which are oriented perpendicularly to the longitudinal axis of the body are usually referred to as the x direction and the y direction for which respective, separate coil systems of the latter kind are used.

The coils used for the precessional excitation of the protons usually are situated in the examination room enclosed by the other coils. For ease of operation the walls of the examination room are often provided with connections for the RF coils in different locations, thus enabling the coils to be arranged on the patient to be examined in conformity with the requirements of the relevant examination. The lines leading to the individual connections, however, may readily be subject to electromagnetic coupling to the RF magnetic fields of the RF coils, so that electric currents and voltages could be generated in the lines and shields. On the one hand, the voltages, currents and electromagnetic fields thus arising falsify the measuring results while on the other hand the induced voltages and currents may reach an order of magnitude such that they become a hazard for the patient to be examined.

In order to avoid at least the voltages and currents which are hazardous to the patient to be examined, it is already known to wrap a conductor around the line to the RF coils. The inductance thus formed is customarily connected in series with a capacitor which is coupled back to the line, the resonance frequency of the resonant circuit thus obtained being tuned to the frequency of the MR apparatus. The line present in the coil of the resonant circuit is thus shielded by means of the excited resonant circuit and the RF signal of the line remains unaffected. It is a drawback, however, that a stray field of the resonant circuit arises, thus necessitating the use of an additional shield for this arrangement. A further drawback in respect of the manufacture and maintenance of this device, moreover, resides in the necessary connection between the capacitor of the resonant circuit and the actual line for the RF signal. These components are connected to one another so as to be quasi inseparable, so that in the case of a defect the complete line, including the shields, must be replaced. The alternative in the form of a modular construction would necessitate a multitude of detachable connections which on the one hand would raise the manufacturing costs to an unacceptable extent while on the other hand the number of vulnerable would strongly increase to the detriment of the availability.

For the shielding of the RF conductor the U.S. Pat. No. 5,742,165 already teaches to enclose the line by means of a cylindrical conductor over a length which corresponds to one quarter of the wavelength of the electromagnetic radiation of the MR apparatus, the relevant wavelength being the wavelength present in a dielectric between the cylindrical shield and the line. At one end the cylindrical shield is short-circuited directly to the line to be shielded whereas at the other axial end it is connected thereto via a capacitor. Because of the connection via the capacitor, the electrically effective length of the cylindrical shield (also referred to as the electrical length hereinafter) is significantly reduced relative to the actual length.

This intricate arrangement has the drawback that a direct connection exists between the RF line and the individual shields, so that in the case of failure of one of the components the entire line with all shields must be replaced at high costs.

SUMMARY

Considering the drawbacks and problems of the present state of the art, it is an object of the invention to provide a resonance trap for a line for conducting electric currents which reliably shields RF electromagnetic radiation and enables a modular construction of the resonance trap on the line.

This object is achieved in accordance with the invention by means of a resonance trap of the kind set forth in which at least one inner conductor extends along the line over a part of its length, that at least one outer conductor extends along the inner conductor, that the inner conductor is arranged at a distance from the line which is smaller than that at which the outer conductor is arranged, and that the outer conductor is arranged so as to cover the inner conductor at least partly relative to the line.

The inner conductor can then extend parallel to the line. Arrangement of the outer conductor parallel to the inner conductor ensures a structurally sensible distance between the conductors and between the conductors and the line. The line and the inner as well as the outer conductor should be situated in such a manner that their principal dimension extends at least partly along a common straight connecting line, thus ensuring high-quality shielding.

An advantage of the resonance trap in accordance with the invention resides in the fact that it is no longer necessary to connect the resonance trap conductively to the line. Because of the dissociation of the resonance trap from the lead, for the first time a modular construction can be realized in which the line and the resonance trap constitute separate components. There is no longer a need for plug-type connections between the line and the resonance trap. The construction of the line and the resonance trap as separate components at the same time enhances the robustness of these two components. The modular construction enables a variety of possibilities for standardization, so that substantial cost savings can be achieved. Finally, the resonance trap in accordance with the invention can be more readily mounted on the MR apparatus, not in the least because of its greater robustness. The line can then be simply slid through the individual resonance traps. The number of resonance traps is chosen in conformity with the length of the line.

In a further embodiment of the invention the inner conductor has an electrical length in the longitudinal direction of the line which corresponds to approximately one quarter of the wavelength in the medium between the inner conductor and the outer conductor for electromagnetic waves of the frequency of the RF alternating currents. The electrical length is dependent above all on the properties of the medium between the inner conductor and the outer conductor, notably the permittivity and the magnetic permeability. A resonance trap which is constructed with an electrical length of one quarter of the wavelength provides a suppression of electromagnetic coupling phenomena with the highest quality factor (for example, Q=250) in a comparatively narrow band region. Similar to the resonance phenomena in an electrical resonant circuit, resonance phenomena of the same kind occur in the arrangement and make the input impedance for electromagnetic waves on the line increase without a barrier in the ideal case. The inner conductor and the outer conductor are constructed so as to be approximately equally long, that is, so that their length corresponds to approximately one quarter of the wavelength which arises in the medium between the inner conductor and the outer conductor for electromagnetic waves of the frequency of the RF alternating currents of the line.

In a further embodiment of the resonance trap in accordance with the invention the inner conductor and the outer conductor are constructed as respective flat plates which extend along the line. In that case it makes sense to utilize a pair-wise oppositely situated arrangement of each time two inner and outer conductors, the line being situated between the two inner conductors. Moreover, more than two resonance traps, consisting of a planar inner conductor and a planar outer conductor, can be arranged around the line. This simple arrangement is extremely robust and achieves a surprisingly high shielding quality factor. The individual resonance traps arranged around the line need not be conductively connected to one another. The open arrangement enables flexible operation and minimizes the work required for mounting. It is also advantageous for the arrangement that the resonance trap in accordance with the invention has an adequate tolerance range with respect to the resonance frequency. A desirable shielding quality factor is obtained even in the presence of large mechanical dimensional tolerances as caused by an inexpensive manufacturing process.

The dimension of the inner conductor, notably transversely of the direction of the line, may be smaller than that of the outer conductor so as to avoid undesirable coupling between the currents of the resonance trap and the environment. It is desirable to short-circuit the arrangement of the inner conductor and the outer conductor at one axial end. In order to reduce the actual length and to tune the resonance frequency, moreover, it makes sense to provide a capacitor, notably at one axial end, between the outer conductor and the inner conductor. A symmetrical combination of two resonance traps may also be advantageous. In that case a capacitor may be provided at the axial center, notably of the outer conductor, or two capacitors may interconnect the inner conductor and the outer conductor at both axial ends. In the former arrangement, that is the arrangement with the capacitor arranged at the axial center, an end short-circuited at both sides would be advantageous.

In another embodiment of the resonance trap the inner conductor and the outer conductor are constructed as respective, conductive hollow cylinders. Upon assembly the line can then be simply fed through the inner conductor, a plurality of resonance traps being arranged at distances from one another in the axial direction which amount to less than one quarter of the wavelength relative to the surrounding medium (usually the atmosphere). The particularly simple construction of the conductors as a hollow cylinder, or as a tube, enables very economical manufacture and is extremely robust. Such an arrangement is particularly suitable for the shielding of lines of small diameter. In addition to a circular or elliptical cross-section, polygonal cross-sections, for example, rectangular or octagonal cross-sections, are also feasible for the conductors of the resonance trap.

For lines of large diameter in accordance with the invention it is arranged that the inner conductor and the outer conductor are constructed as a respective conductive envelope for the line and that the two envelopes are provided with interruptions which are continuous in the longitudinal direction and are distributed along the circumference. A line of large diameter needs an enclosing resonance trap of even larger dimensions in the direction transversely of that of the conductor. As from a given magnitude, however, eddy currents occur in the conductors of comparatively large volume, said eddy currents being induced by the external gradient field. In order to avoid eddy currents which influence the gradient field, the conductors in accordance with the invention are provided with interruptions which are continuous in the longitudinal direction. When this simple step is taken, eddy currents and the associated interference fields are effectively avoided. The resonance trap can thus be constructed as a number of conductors which are distributed along the circumference and extend along the line at two different distances at least.

Different media may be present between the conductors, for example, the ambient air or an appropriate dielectric in order to reduce the actual length. It is also feasible for a liquid medium to be present between the two conductors. The medium present between the conductors may contain protons, because the formation of an interference signal is precluded by the resonance trap.

In order to form a resonance trap which is capable of resonance it is effective to connect the inner conductor conductively to the outer conductor at one axial end. The inductance of the overall arrangement constitutes a line resonator in conjunction with the capacitance of the overall arrangement.

In order to reduce the length of the resonance trap, the inner conductor can be connected, at one axial end and via a capacitor, to the outer conductor at the relevant axial end. The actual length of the resonance trap can thus be significantly reduced, so that the resonance traps which are usually to be arranged in succession in the longitudinal direction of the line are easier to handle notably during the mounting. It is to be noted that the need for shorter shields is often imposed already by the short length of the line to be shielded.

In another embodiment of the invention the two conductors are constructed so as to be symmetrical relative to their axial center, each of the two axial halves having an electrical length in the longitudinal direction of the line which corresponds to approximately one quarter of the wavelength in the medium between the inner and the outer conductor for electromagnetic waves of the frequency of the RF alternating currents of the lead. This construction of the resonance trap essentially consists of two resonance traps which are arranged axially against one another at the end of the connection between the inner conductor and the outer conductor; the currents which otherwise arise in the connection between the inner conductor and the outer conductor because of the symmetry of the arrangement now cancel one another. A conductive connection can thus be omitted between the inner conductor and the outer conductor. A corresponding construction with identical capacitors between the two outer ends of the symmetrical resonance traps reduces the actual length of the resonance trap relative to the electrical length. The electrical length of this resonance trap amounts to one half wavelength of an electromagnetic wave in the medium between the outer and the inner conductor for the frequency of the RF alternating currents of the line.

In another embodiment of the invention the inner conductor is conductively connected to the outer conductor at both actual ends, the outer conductor being interrupted by a capacitor at its axial center. The arrangement is symmetrical relative to the axial center. Because of the mirror symmetry of the arrangement, a central conductive connection between the inner and the outer conductor can be dispensed with, because the currents arising cancel one another. The electrical length of a resonance trap thus constructed amounts to half the wavelength of the frequency to be decoupled.

Another embodiment of the invention is obtained when the resonance trap is formed as part of a line envelope which can be split in the circumferential direction and has, for example, the function of a line guide or a line channel. The interruptions of the conductors which are for the suppression of eddy currents and are formed by interruptions of the resonance trap which extend in the longitudinal direction of the line can also serve as parting grooves of a line guide. The width of the grooves should be based on the requirements as regards the quality factor of the shielding, since wide grooves or wide interruptions in the conductors cause degrading of the shielding quality.

The modular construction of the resonance trap in accordance with the invention enables a line to be provided with a plurality of resonance traps which are tuned to different frequencies. These traps can be arranged, for example, sequentially or coaxially in one another. High-quality decoupling in a plurality of narrow band frequency ranges can thus be achieved for a line, thus enabling operation with different excitation frequencies and different strengths of the main field.

DRAWINGS

Figure 2:
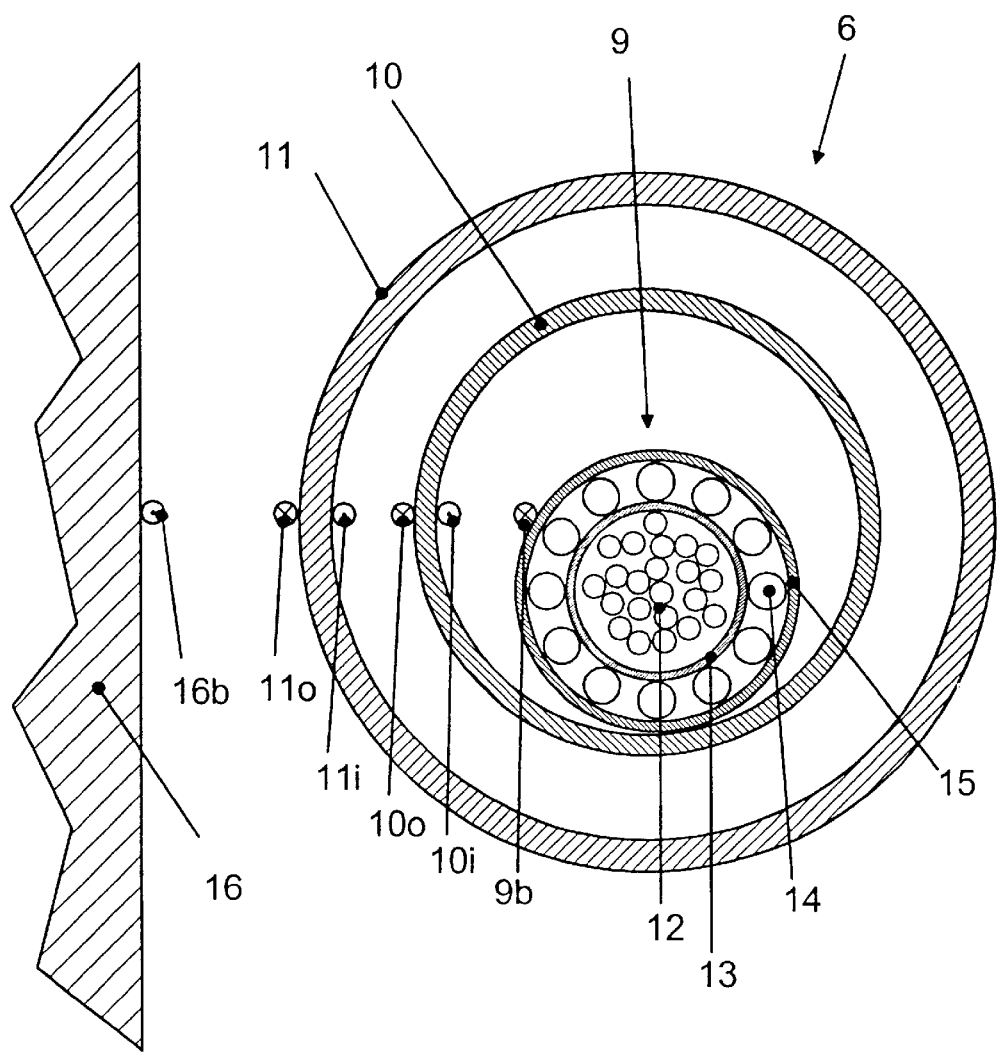
Figure 3:
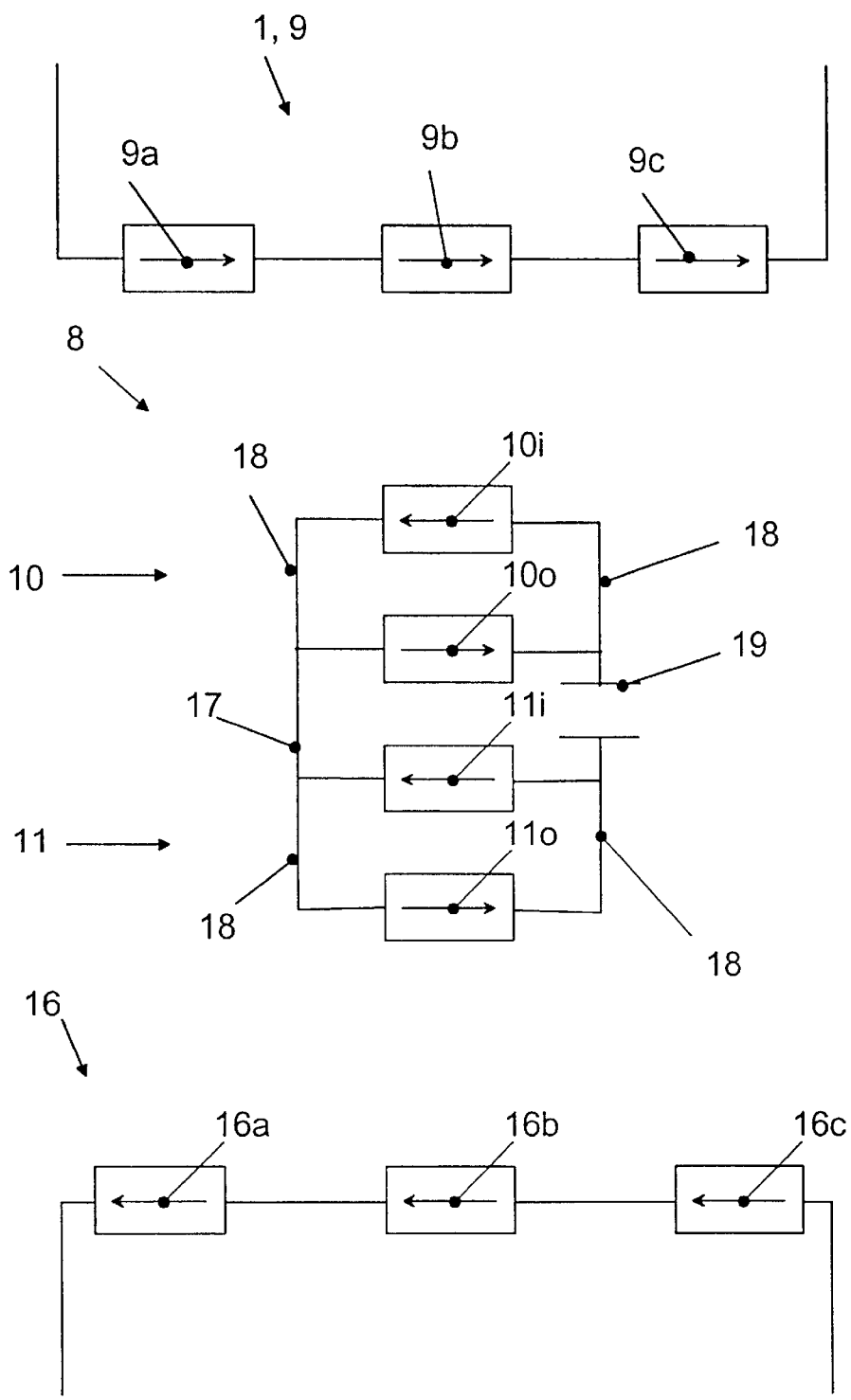
Figure 4:
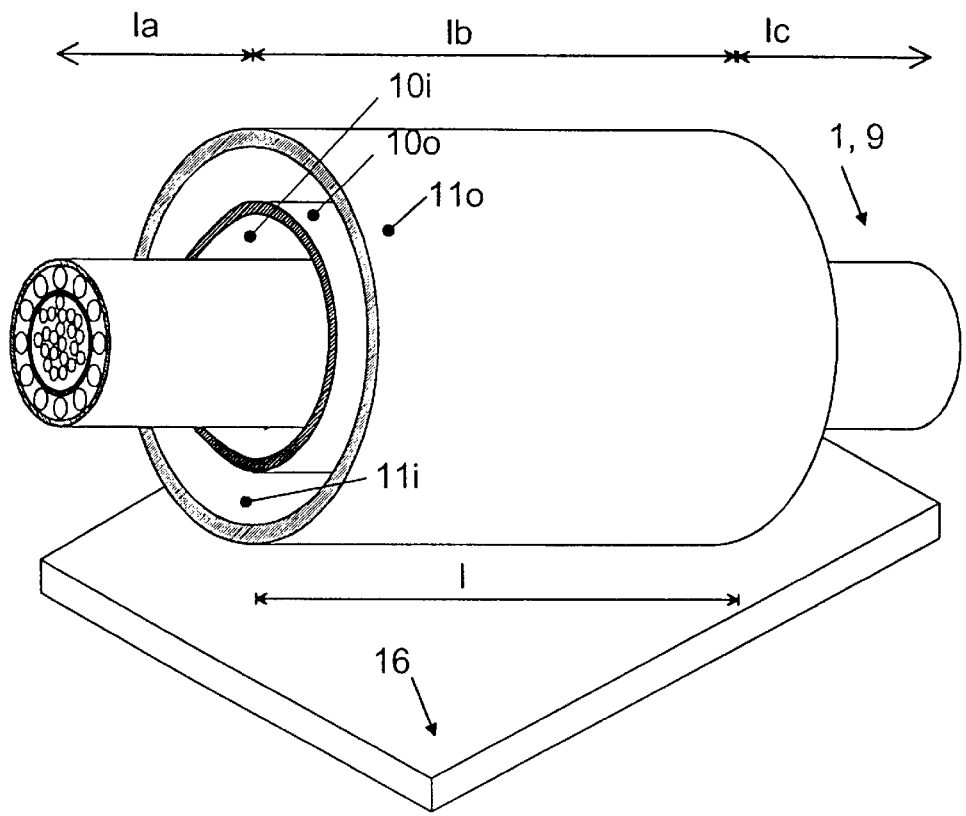
Figure 4:
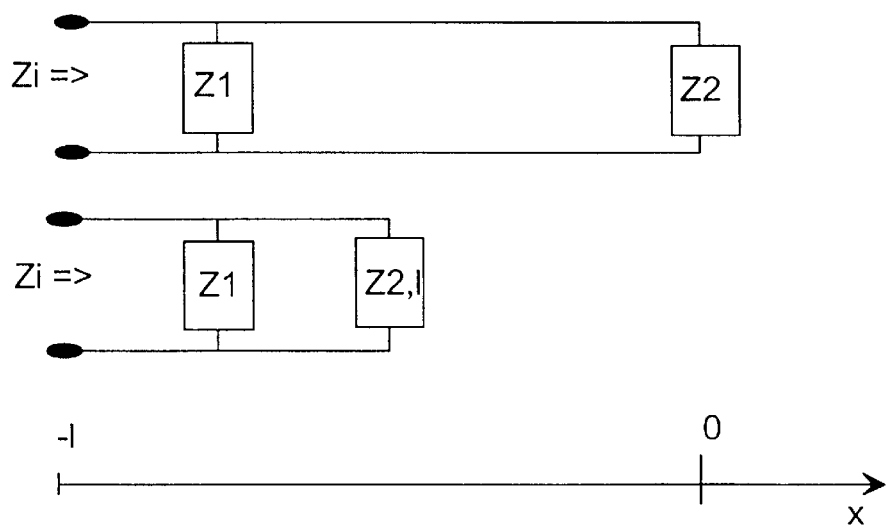
Figure 7:
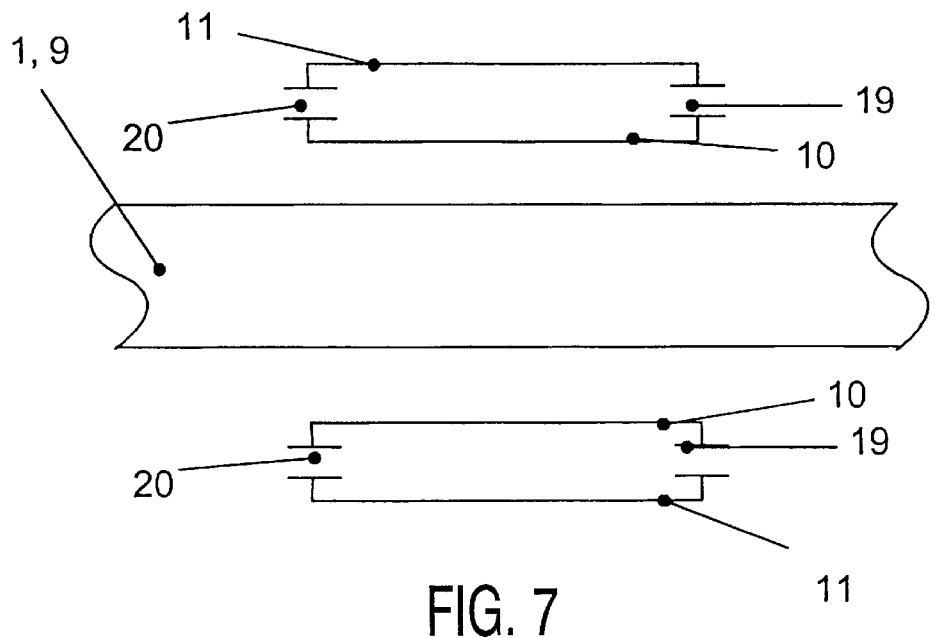
Figure 8:
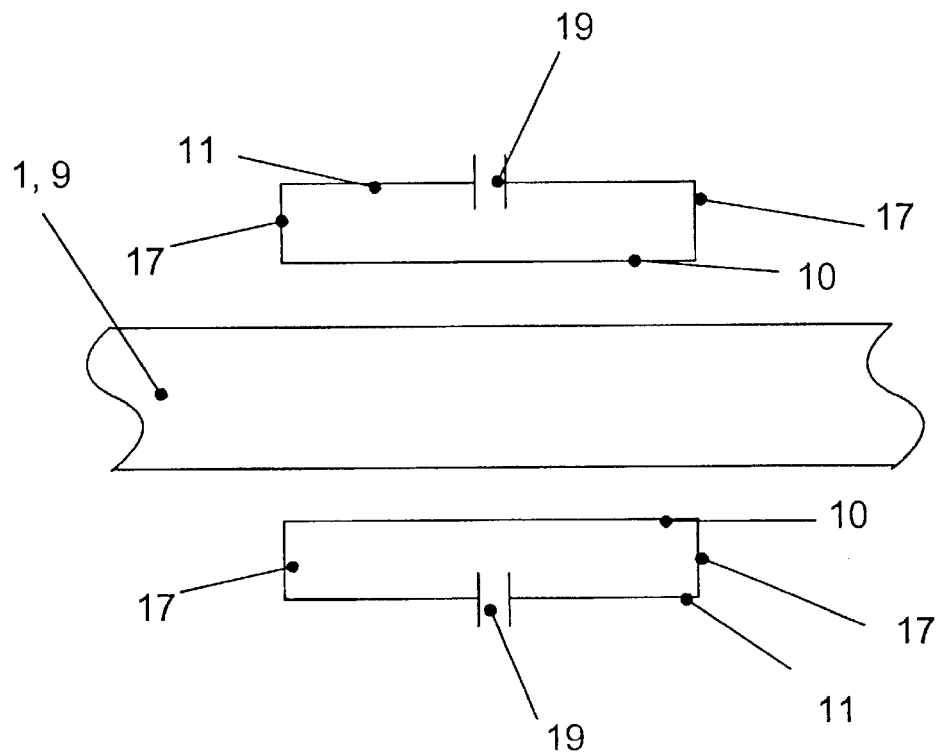
Figure 9:
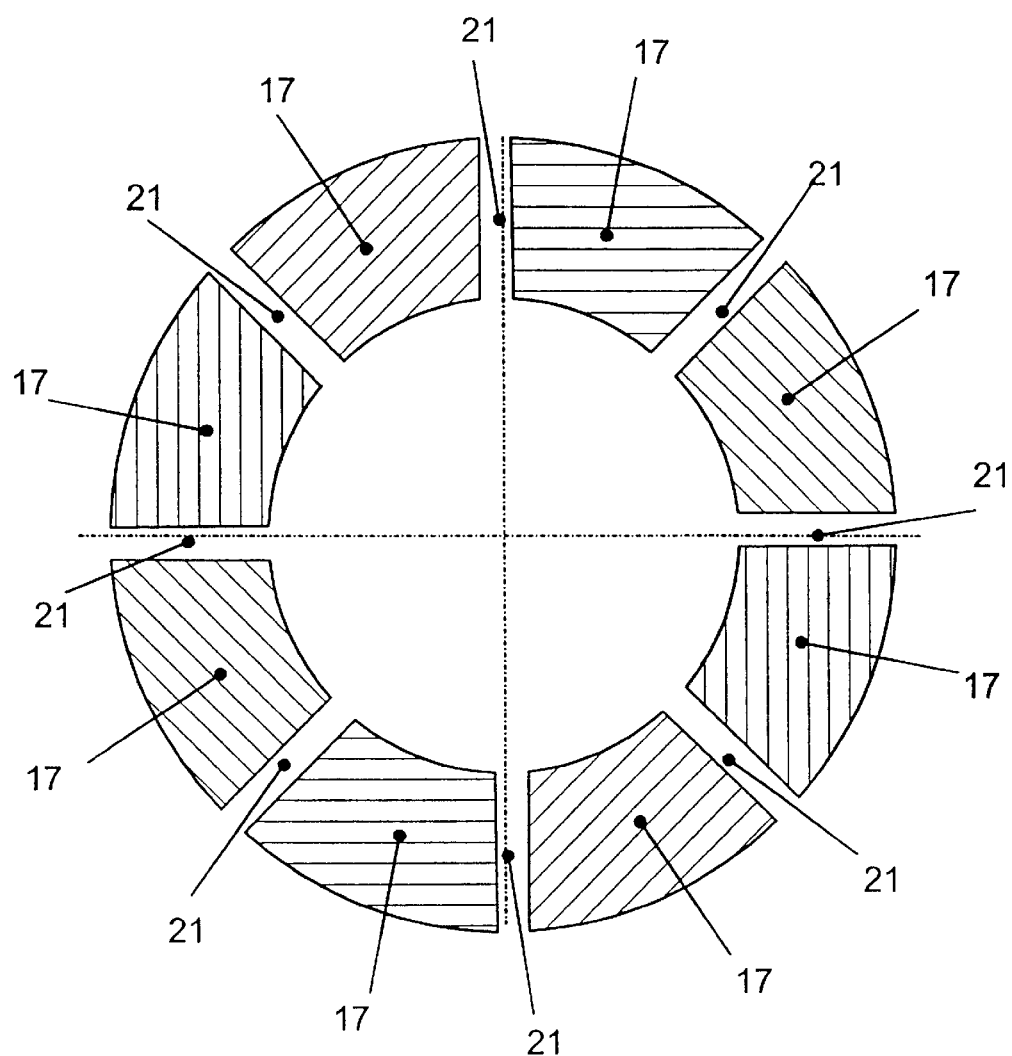
Figure 10:
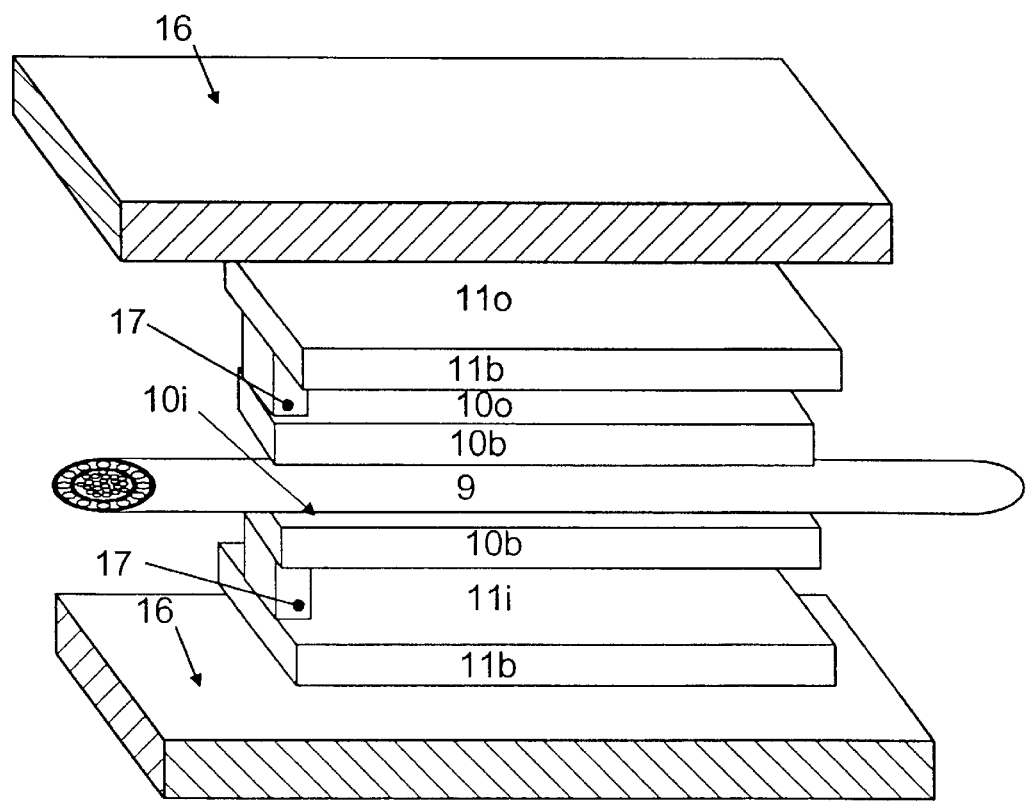

The invention will be described in detail hereinafter with reference to the drawings. Therein:

FIG. 1 is a diagrammatic representation of the arrangement of the components of an MR apparatus, FIG. 2 is a diagrammatic cross-sectional view of a coaxial line which is enclosed by resonance traps in accordance with the invention, FIG. 3 shows an equivalent diagram of the arrangement of FIG. 2, FIG. 4 shows diagrammatically a line which is shielded by means of a resonance trap in accordance with the invention and also an equivalent diagram of the outer surface of the inner conductor and the inner surface of the outer conductor, FIGS. 5, 6, 7, 8 are diagrammatic longitudinal sectional views of a line shielded by means of a resonance trap in accordance with the invention, FIG. 9 is a diagrammatic sectional view of a connection between an inner conductor and an outer conductor of a resonance trap in accordance with the invention, and FIG. 10 is a diagrammatic perspective view of a further embodiment of a resonance trap in accordance with the invention.

DESCRIPTION

The path of a line for RF signals in an examination volume 2 is denoted by the reference numeral 1 in FIG. 1. The line 1 is provided with a connection 3 for an RF coil 4 at one end. At its other end the line 1 is provided with a further connection 5 whereto a filter 6 is connected. The filter 6 is succeeded by a connection 7 for a transmission and receiving amplifier. The part of the line 1 which extends through the examination volume 2 is shielded against disturbing effects by means of resonance traps 8 in accordance with the invention. The interference fields caused by the electromagnetic waves on the line 1 should also be shielded by the resonance traps 8 in accordance with the invention. The ends of the resonance traps 8 which point in the same longitudinal direction of the line 1 are arranged at a distance from the same end of the neighboring resonance trap 8 which is smaller than one quarter of the wavelength of an electromagnetic wave of the frequency of operation of the RF coil of the MR apparatus in the surrounding medium (usually air).

FIG. 2 is a sectional view of a coaxial line 9 which is enclosed by an inner conductor 10 and an outer conductor 11. The coaxial line 9 comprises inner cores 12 which are twisted in a special manner and are enclosed by insulation 13. Around the insulation 13 there are provided external cores 14 which themselves are enclosed by an external insulation 15. The coaxial line 9 is situated in the inner conductor 10 which is constructed as a hollow cylinder and is coaxially arranged in an outer conductor 11. A wall 16 of the examination room 2 is situated at a distance from the line 1 or the coaxial line 9.

FIG. 3 shows an equivalent diagram of the arrangement of FIG. 2 in which the line 1, or the coaxial line 9, is symbolized by three interconnected line segments 9a, 9b, 9c. Directly adjacent the central line segment 9b there are situated the parts of the resonance trap 8 which are also symbolized by line segments, which resonance trap consists of the inner conductor 10 and the outer conductor 11. The inner conductor 10 and the outer conductor 11 are both shown so as to be segmented into a respective inner surface (10$i$) and a respective outer surface (10$o$), the inner surface 10$i$ of the inner conductor 10 adjoining the conductor segment 9b of the line 1, succeeded by the outer surface 10$o$ of the inner conductor 10, the inner surface 11*i* of the outer conductor 11*i* and the outer surface 11*o* of the outer conductor 11*o*. At an axial end of the resonance trap 8 the inner conductor 10 and the outer conductor 11 are short-circuited to one another as represented by the connection 17 in the equivalent diagram of FIG. 3. The conductive connection between the inner surfaces (10*i*, 11*i*) and the outer surfaces (10*o*, 11*o*) is represented at both sides by connections 18. The currents on the inner and outer surfaces influence one another only at the area of the axial ends of the resonance trap 8; the currents on the surfaces 10*i*, 11*i* and the outer surface 10*o*, 11*o* are decoupled from one another in all other locations. At the other axial end of the resonance trap 8 the inner conductor 10 is connected to the outer conductor 11 via a capacitor 19. The capacitor 19 reduces the axial length of the resonance trap 8 relative to its effective electrical length. In the equivalent diagram the upper surface 11*o* of the outer conductor 11 is adjoined by the wall 16 which is symbolized by three successive, interconnected line segments 16*a*, 16*b*, 16*c*.

In the absence of the resonance trap 8, electromagnetic coupling occurs over the entire length between the line 1, or the surface of the coaxial line 9, and the wall 16. The wall 16 and the surface of the coaxial lead 9 thus constitute a transmission line for electromagnetic waves. Depending on the strength of the electromagnetic signals, voltages and currents which are hazardous to the patient may thus arise in the examination volume 2. Therefore, the line 1, or the coaxial line 9, is shielded from the surrounding components by means of resonance traps 8 at distances amounting to one quarter of the wavelength at the most. In respect of the electromagnetic waves this means a segmentation of the line 1, or the coaxial lead 9, in short segments alternating in the longitudinal direction with segments shielded by resonance traps 8. Such a segmentation of the line 1 inhibits the undesirable effects of the formation of hazardous voltages and disturbing radiation. The currents induced in the individual line segments 9*a*, 9*b*, 9*c*, 10*i*, 10*o*, 11*i*, 11*o*, 16*a*, 16*b*, 16*c* which are symbolically shown in FIG. 3 are symbolized by respective arrows. In FIG. 2 these currents are indicated analogously on the surfaces of the components involved. The currents on the neighboring components are always oriented anti-parallel to one another. Electromagnetic coupling takes place between the line 1, or the coaxial line 9, and the wall 16, that is, between the non-shielded line segments in front of (9*a*, 16*a*) and behind (9*c*, 16*c*) the resonance trap 8. Furthermore, coupling takes place between the shielded surface 9*b* of the coaxial line 9 and the inner surface 10*i* of the inner conductor 10, the outer surface 10*o* of the inner conductor 10 and the inner surface 11*i* of the outer conductor 11 as well as between the outer surface 11*o* of the outer conductor 11 and the neighboring surface 16*b* of the wall 16.

The physical relationships will be described in brief hereinafter. The line 1, or the coaxial line 9, as shown in FIG. 4 is enclosed over a length 1 by the resonance trap 8 in accordance with the invention. Electric currents as shown in FIG. 3 are formed on the inner and outer surfaces of the conductors 10, 11. The electromagnetic coupling effect occurs exclusively at the axial ends of the resonance trap 8 as symbolized by the impedances $Z_1$ and $Z_2$ between the inner and the outer surface of the conductors 10, 11 in the equivalent diagrams of FIG. 3. The length of the resonance trap 8 is taken into account by the impedance $Z_{2,1}$.

The following relationships arise from the equivalent diagram of FIG. 4.

The parallel connection $Z_1$, $Z_{2,1}$ yields the input resistance $Z_i$:

$$Z_i = \frac{Z_1 \cdot Z_{2,l}}{Z_1 + Z_{2,l}}$$

In conformity with Ohm's law, the following values are obtained at the two axial ends of the resonance trap 8:

$$Z_1 = \frac{U(x=-l)}{I(x=-l)} \; Z_2 = \frac{U(x=0)}{I(x=0)}$$

Suppression of the electromagnetic coupling is achieved when the input impedance becomes very high. In the case of resonance, the input impedance strongly increases; this fact is used by the resonance trap 8 in accordance with the invention. The resonance condition in ideal circumstances (with negligibly small ohmic losses), so $Z_i \rightarrow \infty$, the assumption of pure blind resistances $Y_1$, $Y_2$ and the characteristic impedance $Z_0$ for the wave propagation together yield the following condition for resonance:

$$\tan(\beta \cdot l) = \frac{(Y_1 + Y_2) \cdot Z_0}{-Y_1 \cdot Y_2 + Z_0^2} \rightarrow \infty$$

where $$\beta = \frac{2 \cdot \pi}{\lambda}$$

is a phase constant of the wave propagation on the line which results from the wavelength $\lambda$ in the medium between the inner (10) and the outer conductor (11). The input impedance of the resonance trap 8 strongly increases in the case of resonance (ideally: $Z_i \rightarrow \infty$), which means a segmentation of the line 1. When a capacitor 19 connects the outer conductor (11) and the inner conductor (10) to one another at one axial end $$\left(Y_1 = \frac{1}{2 \cdot \pi \cdot f \cdot C}\right)$$

and the other axial end is short-circuited ($Y_2 = 0$), the following will be obtained for the length of the resonance trap 8:

$$\tan(\beta \cdot l) = \frac{1}{Z_0 \cdot 2 \cdot \pi \cdot f \cdot C}$$

In the absence of a capacitor ($C=0$) the length is:

$$\tan(\beta \cdot l) \rightarrow \infty \; l = \frac{2 \cdot n + 1}{4} \cdot \lambda$$

For example, for $$n = 0: \; l = \frac{\lambda}{4}$$

Figure 5:
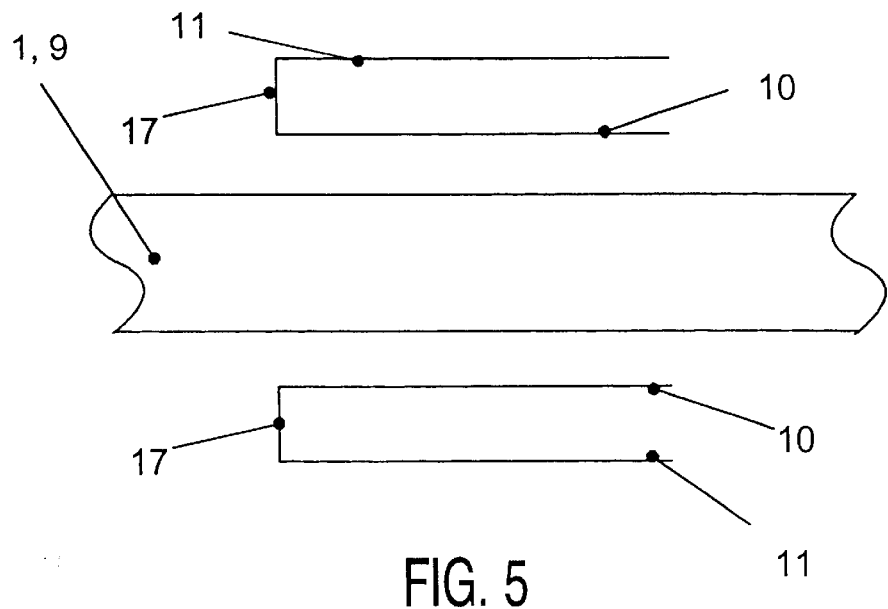

The line 1 is enclosed by the resonance trap 8 in FIG. 5, the inner conductor 10 being short-circuited to the outer conductor 11 at one end, that is, via the connection 17. The other end of the two conductors 10, 11 remains open, the properties of the line resonator then being governed by the geometry, the inductance and the capacitance.

Figure 6:
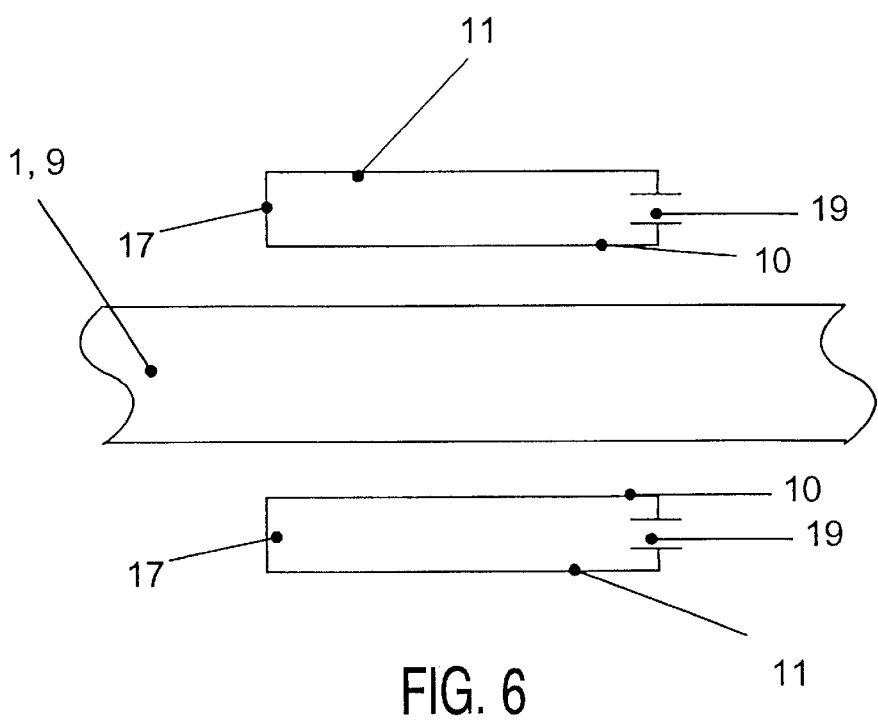

In FIG. 6 the line 1 is enclosed by a resonance trap 8 which is short-circuited at one axial end via the connection 17 between the inner conductor 10 and the outer conductor 11. At the other axial end the inner conductor 10 and the outer conductor 11 are connected to one another via a capacitor 19.

In FIG. 7 the line is enclosed by a resonance trap 8 which also includes an inner conductor 10 and an outer conductor 11, the inner conductor 10 being connected to the outer conductor 11 at both axial ends, that is, via respective capacitors 19 and 20. The total electrical length of the resonance trap 8 then amounts to length of one half wavelength propagating in the medium between the inner and the outer conductor at the frequency of the alternating current in the line 1. In the arrangement of FIG. 7 essentially two resonance traps 8 in conformity with the embodiment of FIG. 6 are arranged against one another by way of their short-circuited end; because of the symmetry, the short-circuit connection 17 between the inner conductor 10 and the outer conductor 11 can be dispensed with at the axial center of the resonance trap 8.

In the resonance trap 18 which is diagrammatically shown in FIG. 8 the inner conductor 10 is conductively connected to the outer conductor 11 at both axial ends. The outer conductor 11 is interrupted by a capacitor 19 at its axial center. The arrangement is symmetrical relative to the axial center. This embodiment consists in principle of the connection of resonance traps 8 in accordance with the invention which are provided with a capacitor at one axial end and are short-circuited each time at the other axial end. In this context the two capacitors can be combined so as to form a single capacitor.

Proposed embodiments can be provided with interruptions 21 which are distributed along the circumference and extend in the longitudinal direction of the resonance trap 8. FIG. 9 is a cross-sectional view of a short-circuited axial end of a resonance trap 8. The eight connections 17 which are distributed along the circumference can be constructed as a "printed circuit board". Distributed along the circumference, the connections 17 are separated from one another by the interruptions 21 which extend in the longitudinal direction of the resonance trap 8.

FIG. 10 shows a further embodiment of a resonance trap 8 in accordance with the invention. The inner conductor 10 and the outer conductor 11 are constructed as respective planar, rectangular, oppositely situated plates and extend parallel to one another and to the line 9 situated between the inner conductors. The planar dimension of the inner conductors 10 is chosen so as to be smaller than that of the outer conductors 11. A connection 17 short-circuits the inner conductor 10 to the outer conductor 11 at one axial end. The inner conductor 10 and the outer conductor 11 have a respective open end at the other axial end.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A resonance trap for suppressing electromagnetic coupling phenomena for at least one line for conducting RF alternating currents in an MR apparatus, the resonance trap comprising:

at least one inner conductor which extends along the line over a part of its length; and at least one outer conductor which extends along the inner conductor; wherein the inner conductor is arranged at a distance from the line which is smaller than that at which the outer conductor is arranged, and that the outer conductor is arranged so as to cover the inner conductor at least partly relative to the line.

2. A resonance trap as claimed in claim 1, wherein the inner conductor has an electrical length in the longitudinal direction of the line which corresponds to approximately one quarter of the wavelength of electromagnetic waves propagating in the medium between the inner conductor and the outer conductor at the frequency of the RF alternating currents of the line.

3. A resonance trap as claimed in claim 1, wherein the inner conductor and the outer conductor are constructed as respective flat plates which extend adjacent the line.

4. A resonance trap as claimed in claim 1, wherein the inner conductor and the outer conductor are constructed as respective conductive, hollow cylinders.

5. A resonance trap as claimed in claim 1, wherein the inner conductor and the outer conductor are constructed as respective conductive envelopes of the line, the two envelopes comprising interruptions which are distributed along the circumference and are continuous in the longitudinal direction.

6. A resonance trap as claimed in claim 1, wherein the inner conductor is conductively connected to the outer conductor at one axial end.

7. A resonance trap as claimed in claim 1, wherein at one axial end the inner conductor is connected, via a capacitor, to the outer conductor at said axial end.

8. A resonance trap as claimed in claim 1, wherein at one axial end the inner conductor is connected, via a capacitor, to the outer conductor at said axial end and that at the other axial end the inner conductor is conductively connected to the outer conductor at said other axial end.

9. A resonance trap as claimed in claim 1, wherein at both axial ends the inner conductor is connected, via capacitors, to the outer conductor at these axial ends.

10. A resonance trap as claimed in claim 1, wherein at both axial ends the inner conductor is conductively connected to the outer conductor and that the outer conductor is interrupted by a capacitor at its axial center.

11. A resonance trap as claimed in claim 1, wherein the two conductors are constructed so as to be symmetrical relative to their respective axial center, each of the two axial halves having an electrical length in the longitudinal direction of the line which corresponds to approximately one quarter of the wavelength of electromagnetic waves propagating in the medium between the inner and the outer conductor at the frequency of the RF alternating currents of the line.

12. A resonance trap as claimed in claim 1, wherein the inner conductor and the outer conductor form part of a line envelope which can be segmented in a direction following the perimeter of the line envelope.

13. A resonance trap as claimed in claim 1, wherein a plurality of resonance traps which are tuned to different frequencies is provided on a line.

* * * * *